May 19, 1959 C. H. ZIERDT, JR 2,887,628

SEMICONDUCTOR DEVICE CONSTRUCTION

Filed June 12, 1956

INVENTOR:
CONRAD H. ZIERDT, JR.

BY Julius J. Zaskalicky
HIS ATTORNEY.

United States Patent Office 2,887,628

Patented May 19, 1959

2,887,628

SEMICONDUCTOR DEVICE CONSTRUCTION

Conrad H. Zierdt, Jr., Syracuse, N.Y., assignor to General Electric Company, a corporation of New York Application June 12, 1956, Serial No. 590,901

2 Claims. (Cl. 317—234)

Figure 1:
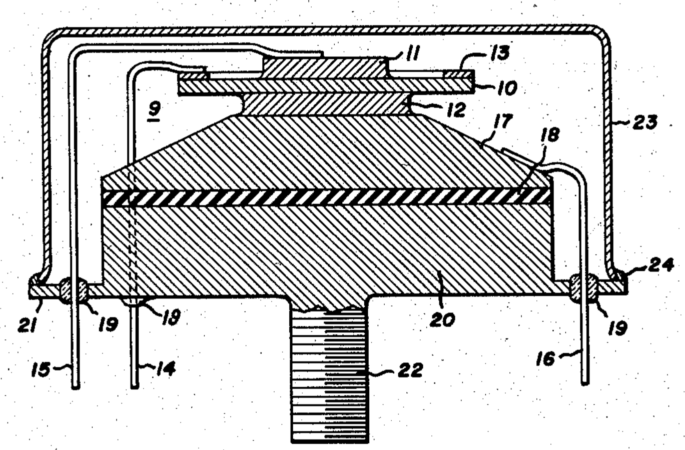

This invention relates generally to improvements in semiconductor devices, and more particularly relates to a construction for such devices which permits rapid removal of self-generated heat therefrom without limiting the manner in which electrical connections may be made thereto.

In prior art disclosures, it has been customary to provide a direct metallic connection between the heat generating portion of a semiconductor device and a heat conductive stud or other suitable mounting means which is connected to a suitable heat radiator or heat sink; such as a metallic chassis. Thus, self-generated heat is transferred by conduction through the stud to the heat sink to be dissipated by the ambient atmosphere. Such a direct connection places the heat sink at the same electrical potential as a portion of the semiconductor device, thus limiting the application of the device in electrical circuits.

Accordingly, it is an object of this invention to provide a new and improved semiconductor structure for facilitating the removal of self-generated heat from semi-conductor devices at a rapid rate without limiting the manner of making electrical connections thereto.

It is a further object of this invention to provide a new and improved semiconductor device construction which provides a simple and effective means for electrically insulating the internal elements of a semiconductor device from a heat radiator.

Still another object of this invention is to provide a new and improved semiconductor device structure which protects the necessary insulating material, utilized for heat transfer and electrical insulation, from damage by environment, handling or other deleterious influences.

In carrying out the present invention in one illustrative embodiment thereof, a layer of electrical insulating material having a relatively high thermal conductivity, such as beryllium oxide, is interposed between the internal elements of a semiconductor device and a metallic heat conductor which is adapted to be secured to a heat radiator, such as a metallic chassis. Such an arrangement allows for the conduction of heat from the semiconductor device to the heat radiator while maintaining the semiconductor device in electrically insulated relationship to the heat radiator.

These and other advantages of this invention may be more clearly understood by the following description taken in connection with the accompanying drawings, and its scope will be apparent from the appended claims.

Figure 2:
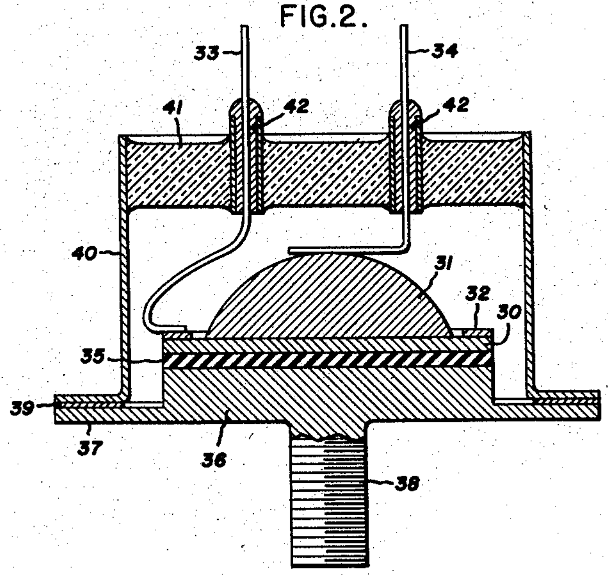

In the drawings,

Figure 1 shows a cross-sectional view of one embodiment of this invention as applied to a transistor device; and Figure 2 shows a cross-sectional view of another embodiment of this invention as applied to a semiconductor rectifying device.

Since the present invention has particular utility in connection with electrical devices that generate a relatively large amount of heat per unit volume, such as semiconductor junction devices, the illustrative embodiments selected to describe the invention relate to such devices. However, the invention is not limited to the specific type of semiconductor devices shown and described, but includes all such devices from which heat must be rapidly and efficiently removed while the internal elements of the semiconductor device are required to be maintained in electrically insulated relationship with a heat radiator.

Referring now to Figure 1, a transistor device is shown incorporating the principles of this invention. The transistor device 9 comprises a thin wafer of semiconductor material 10 of N-type conductivity having opposed surfaces. Into each of the opposed surfaces respective bodies of acceptor materials 11 and 12 are diffused in a manner well known in the art to form internally of the wafer 10 a pair of P–N junctions. If the wafer 10 is constituted of N-conductivity type silicon, aluminum would be suitable for an acceptor material, or if wafer 10 consists of germanium, indium would be a suitable acceptor material. The transistor so formed is referred to as a P–N–P type of transistor. As will appear obvious to those skilled in the art, an N–P–N type transistor also may be used. The transistor so formed is mounted on a truncated conical element 17 of suitable heat conductive material. A base electrode connection 13 is conductively attached as by suitably soldering, for example, to wafer 10 to provide an ohmic connection thereto as is well known in the art. Base lead 14 is conductively attached to electrode 13. Emitter lead 15 is suitably attached to mass 11 and a collector lead 16 is connected to element 17 which is secured by mass 12 by soldering thereto, for example, as is well known in the art.

A heat conductive stud 20 is provided with an annular flange 21 and a threaded screw 22 which is adapted to be bolted to a heat radiator or sink, such as a metallic chassis (not shown). Element 17 is mounted on stud 20 by means of a layer of electrical insulating material 18 having a relatively high thermal conductivity. The layer of insulating material 18 is metallized in a manner well known in the art on opposed surfaces of material 18 and soldered to elements 17 and 20. As an alternative, these elements may be clamped together. A cap 23 is provided having a flange in registry with flange 21 and welded or suitably sealed thereto. The electrical connections 14, 15 and 16 pass through the openings 19 in the flange 21. The unit is hermetically sealed at openings 19 by glass beads in a manner well known in the art.

The insulating material 18 which is disposed between element 17 and stud 20 must have the property of being a good electrical insulator and also be characterized by a relatively high thermal conductivity. Beryllium oxide (BeO) which has a thermal conductivity equal to that of pure aluminum and a resistivity of $10^{14}$ ohm-centimeters is preferably used for this purpose. However, magnesium oxide (MgO), aluminum oxide ($Al_2O_3$) and beryllia particles disbursed in a bonding cement are other examples of a suitable material. The insulating medium may be applied by spray, or inserted as a thin wafer, or used in any other suitable manner.

The self-generated heat from the transistor 9, the major portion of which is generated by the collector-base junction, must be dissipated in order for the transistor to function satisfactorily and be capable of handling large amounts of power. This heat is transferred directly to element 17 which has a truncated, conical configuration in order to transfer the heat most efficiently from collector 12 through layer 18 to stud 20. Stud 20 is connected to a heat sink from which the heat is ultimately dissipated into the ambient atmosphere. By positioning the layer of insulating material as shown, the collector electrode 12 is electrically insulated from the stud 20, the heat radiator and the cap 23. Consequently, the heat radiator or stud does not have the same electrical potential as that which is applied to collector electrode 12. Accordingly, there are no restrictions on the manner of utilization of the transistor device in electrical circuits which would exist were the collector electrode potential connected directly to a heat radiator.

Although Figure 1 shows element 17 interposed between the collector electrode 12 and the layer of insulating material 18, it is also herein contemplated that the layer 18 may be applied directly to the collector, base or emitter electrodes such as illustrated in Figure 2 in connection with a rectifying device.

Referring now to Figure 2, a thin wafer of semi-conductor material 30 of N-type conductivity is impregnated with an acceptor impurity 31, forming a P-N junction. A ring member 32 is connected to wafer 30 to constitute one electrode of the semiconductor rectifier to which external lead 33 is conductively attached. External lead 34 is connected to acceptor impurity mass 31 constituting the other electrode of the semiconductor rectifying device. A thin layer of insulating material 35 having a relatively high thermal conductivity is metallized on opposed surfaces thereof which are then soldered respectively to wafer 30 and to a heat conductive stud 36. Stud 36 is provided with an annular flange 37 to which a cap 40 is soldered along surface 39. Stud 36 is threaded at 38 adapting the device for bolting to a heat radiator or heat sink. The unit is enclosed by an annular glass insulator 41 mounted on cap 40 and having channels 42 therein adapted to house leads 33 and 34. The housing is hermetically sealed by filling openings 42 with solder.

The self-generated heat from semi-conductor junction 31—30 is transferred by layer 35 to conductive stud 36 and thence to the heat sink to which the stud is attached. The provision of a layer such as electrically insulating layer 35 effectively electrically insulates the semiconductor device from the stud 36 and the heat radiator; consequently such provision does not limit the electrical circuit applications of the resultant device.

As will appear obvious from inspection, the layer of insulating material 35 is completely protected from damage by environment or by handling. This is also applicable with respect to insulating layer 18 of Figure 1.

Since other modifications varied to fit particular operating requirements and environments will be apparent to those skilled in the art, the invention is not considered limited to the examples chosen for purposes of disclosure and covers all modifications and changes which do not constitute departures from the true spirit and scope of this invention.

What I claim as new and desire to secure by Letters Patent of the United States is:

1. A semiconductor device comprising a body of semiconductive material including a region of one conductivity type and another region of the opposite conductivity type meeting in a P-N junction, a body of beryllium oxide, a conductive base member, means for bonding one portion of said body of beryllium oxide to one of said regions and another portion thereof to said base member, means for making electrical connections to said regions, and means for making thermal connection to said base member.

2. A semiconductor device comprising a body of semiconductive material including a region of one conductivity type and another region of the opposite conductivity type meeting in a P-N junction, a body of beryllium oxide material having a pair of distinctive surface portions thereof metallized to provide good thermal contact thereto, a conductive base member, means for bonding one of said metallized portions to one of said regions and the other of said metallized portions to said base member, means for making electrical connections to said regions, and means for making thermal connection to said base member.

References Cited in the file of this patent

UNITED STATES PATENTS

| | | |
|---|---|---|
| 2,725,505 | Webster et al. | Nov. 29, 1955 |
| 2,738,452 | Martin | Mar. 13, 1956 |
| 2,740,075 | Walker et al. | Mar. 27, 1956 |
| 2,777,975 | Aigrain | Jan. 15, 1957 |
| 2,817,048 | Thuermel et al. | Dec. 17, 1957 |
| 2,820,929 | Coy | Jan. 21, 1958 |
| 2,825,014 | Willemse | Feb. 25, 1958 |